(12) United States Patent
Song

(10) Patent No.: US 8,209,862 B2
(45) Date of Patent: Jul. 3, 2012

(54) INSULATING MATERIAL AND PRINTED CIRCUIT BOARD HAVING THE SAME

(75) Inventor: Jong-Seok Song, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/137,935

(22) Filed: Sep. 21, 2011

(65) Prior Publication Data

US 2012/0012375 A1 Jan. 19, 2012

Related U.S. Application Data

(62) Division of application No. 12/285,318, filed on Oct. 1, 2008.

(30) Foreign Application Priority Data

Dec. 27, 2007 (KR) .......................... 10-2007-0139192

(51) Int. Cl.
*H01K 3/10* (2006.01)

(52) U.S. Cl. ............................... 29/852; 174/258; 442/59

(58) Field of Classification Search .................... 29/852; 174/258; 442/59

See application file for complete search history.

(56) References Cited

U.S. PATENT DOCUMENTS

| 7,794,820 B2 | 9/2010 | Kim et al. |
| 8,034,460 B2 * | 10/2011 | Kim et al. .................. 428/458 |
| 2008/0107457 A1 * | 5/2008 | Katoh ........................ 399/302 |
| 2009/0166076 A1 * | 7/2009 | Song ........................... 174/262 |

OTHER PUBLICATIONS

U.S. Patent Notice of Allowance mailed Dec. 9, 2011 in U.S. Appl. No. 12/285,318.
U.S. Patent Restriction Requirement mailed Jun. 27, 2011 in corresponding U.S. Appl. No. 12/285,318.
U.S. Patent Office Action mailed Aug. 23, 2011 in corresponding U.S. Appl. No. 12/285,318.
U.S. Appl. No. 12/285,318, filed Oct. 1, 2008, Jong-Seok Song, Samsung Electro-Mechanics Co., Ltd.

* cited by examiner

*Primary Examiner* — Derris Banks
*Assistant Examiner* — Azm Parvez

(57) ABSTRACT

An insulating material formed by impregnating a base material with a liquid composition and curing the liquid composition, the liquid composition being 20 to 50 parts by weight of a PMDA-ODA mixture, the PMDA-ODA mixture including pyromellitic dianhydride (PMDA) and oxydianiline (ODA) mixed in a weight ratio of 40:60 to 60:40; 50 to 80 parts by weight of a triazine derivative; and 300 to 600 parts by weight of an organic solvent. A printed circuit board includes an insulator formed of the above insulating material; a circuit pattern formed on one or either side of the insulator; and a via penetrating the insulator.

10 Claims, 15 Drawing Sheets

INSULATING MATERIAL AND PRINTED CIRCUIT BOARD HAVING THE SAME

CROSS-REFERENCE TO RELATED APPLICATIONS

This application is a U.S. divisional application filed under 37 CFR 1.53(b) claiming priority benefit of U.S. Ser. No. 12/285,318 filed in the United States on Oct. 1, 2008, which claims earlier priority benefit to Korean Patent Application No. 10-2007-0139192 filed with the Korean Intellectual Property Office on Dec. 27, 2007 the disclosures of which are incorporated herein by reference.

BACKGROUND

1. Field

The present invention relates to an insulating material, a printed circuit board that utilizes the insulating material, and a method of manufacturing the printed circuit board.

2. Description of the Related Art

Current methods for forming circuit patterns on a printed circuit board (PCB) include subtractive methods, additive methods, semi-additive methods, and modified semi-additive methods, etc.

HDI (high density interconnection) products mostly employ subtractive methods, while UTCSP (ultra-thin chip scale package) products and BGA (ball grid array) products mostly employ subtractive methods and modified semi-additive methods. FCBGA (flip chip BGA) products mainly use subtractive methods and semi-additive methods.

The insulation material in each type of product can be FR-4 (Flame Retardant 4), BT (Bismaleimide-Triazine), ABF (Ajinomoto build-up film), etc.

The materials and methods described above, however, are reaching a limit in terms of implementing fine-line circuits according to the current demands for lighter, thinner, and smaller products.

Thus, there is a need for new insulating materials suited for forming fine-line circuits, as well as for a method of manufacturing a printed circuit board having fine-line circuits using such insulating material.

SUMMARY

An aspect of the invention provides an insulating material that provides improved adhesion between the insulating material and the circuit pattern, to enable the forming of fine-line circuit patterns, and also provides a printed circuit board that utilizes the insulating material and a method of manufacturing the printed circuit board.

Another aspect of the invention provides an insulating material formed by impregnating a base material with a liquid composition and curing the liquid composition. Here, the liquid composition can include 20 to 50 parts by weight of a PMDA-ODA mixture, which can include pyromellitic dianhydride (PMDA) and oxydianiline (ODA) mixed in a weight ratio of 40:60 to 60:40; 50 to 80 parts by weight of a triazine derivative; and 300 to 600 parts by weight of an organic solvent.

The triazine derivative can be bismaleimide triazine, and the organic solvent can be one of dimethylformamide (DMF) and dimethylacetamide (DMAC) or a mixture thereof.

The base material can be a material selected from a group consisting of fiberglass fabric, fiberglass non-woven fabric, polyamide fabric, polyamide non-woven fabric, polyester fabric, and polyester non-woven fabric. When the liquid composition is impregnated into the base material and cured, the curing of the liquid composition can be performed at a temperature of 180 to 250° C.

Yet another aspect of the invention provides a printed circuit board that includes an insulator, a circuit pattern formed on one or either side of the insulator, and a via penetrating the insulator. The insulator can be formed by impregnating a base material with a liquid composition and curing the liquid composition, where the liquid composition can include 20 to 50 parts by weight of a PMDA-ODA mixture, which can include pyromellitic dianhydride (PMDA) and oxydianiline (ODA) mixed in a weight ratio of 40:60 to 60:40; 50 to 80 parts by weight of a triazine derivative; and 300 to 600 parts by weight of an organic solvent.

The triazine derivative can be bismaleimide triazine, and the organic solvent can be one of dimethylformamide (DMF) and dimethylacetamide (DMAC) or a mixture thereof.

The base material can be a material selected from a group consisting of fiberglass fabric, fiberglass non-woven fabric, polyamide fabric, polyamide non-woven fabric, polyester fabric, and polyester non-woven fabric. When the liquid composition is impregnated into the base material and cured, the curing of the liquid composition can be performed at a temperature of 180 to 250° C.

Still another aspect of the invention provides a method of manufacturing a printed circuit board, which includes a circuit pattern and at least one via. The method includes perforating at least one through-hole corresponding with the at least one, which is in correspondence with the via, in a first insulator; applying a surface treatment on the first insulator by irradiating an ion beam; forming a first seed layer over an inner wall of the through-hole and over one or either side of the first insulator; forming a first plating resist over one or either side of the first insulator on which the first seed layer is formed; performing electroplating in correspondence with the circuit pattern and the via; removing the first plating resist; and removing a portion of the first seed layer by flash etching.

Here, the insulator can be formed by impregnating a base material with a liquid composition and curing the liquid composition, where the liquid composition can include 20 to 50 parts by weight of a PMDA-ODA mixture, which can include pyromellitic dianhydride (PMDA) and oxydianiline (ODA) mixed in a weight ratio of 40:60 to 60:40; 50 to 80 parts by weight of a triazine derivative; and 300 to 600 parts by weight of an organic solvent.

The triazine derivative can be bismaleimide triazine, and the organic solvent can be one of dimethylformamide (DMF) and dimethylacetamide (DMAC) or a mixture thereof.

The base material can be a material selected from a group consisting of fiberglass fabric, fiberglass non-woven fabric, polyamide fabric, polyamide non-woven fabric, polyester fabric, and polyester non-woven fabric.

Applying the surface treatment can be performed using a gas containing one of argon (Ar), oxygen ($O_2$), and nitrogen ($N_2$), or a mixture thereof. Forming the seed layer can be performed by vacuum deposition.

The method may further include, after removing the portion of the first seed layer, stacking a second insulator over one or either side of the first insulator, forming at least one blind via hole in the second insulator, applying a surface treatment on the second insulator by irradiating an ion beam, forming a second seed layer over an inner wall of the blind via hole and over one or either side of the second insulator, forming a second plating resist over one or either side of the second insulator on which the second seed layer is formed, performing electroplating, removing the second plating resist, and removing a portion of the second seed layer by flash etching.

Additional aspects and advantages of the present invention will be set forth in part in the description which follows, and in part will be obvious from the description, or may be learned by practice of the invention.

DESCRIPTION OF EMBODIMENTS

Figure 1:
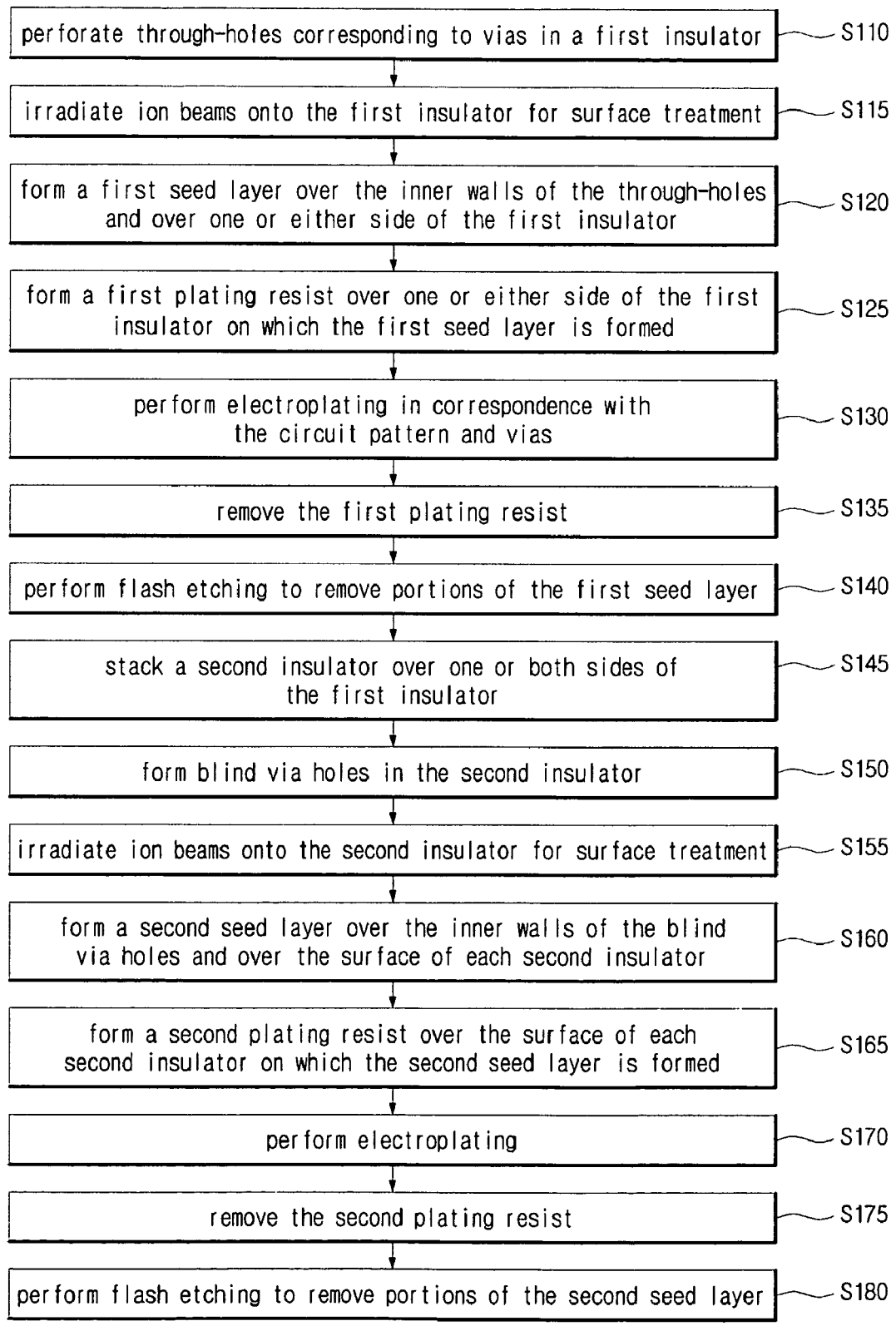
FIG. 1 is a flowchart illustrating a method of manufacturing a printed circuit board according to an embodiment of the invention.
Figure 2:
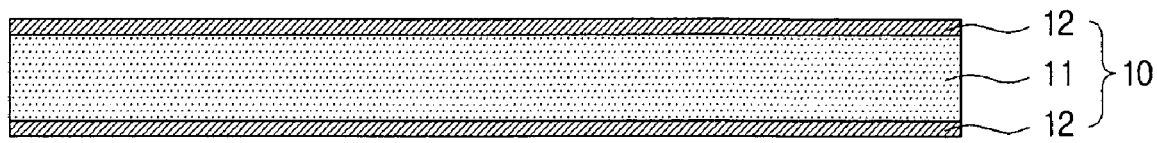
FIG. 2, FIG. 3, FIG. 4, FIG. 5, FIG. 6, FIG. 7, FIG. 8, FIG. 9, FIG. 10, FIG. 11, FIG. 12, FIG. 13, FIG. 14, and FIG. 15 are cross sectional views each representing a process for a method of manufacturing a printed circuit board according to an embodiment of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

Certain embodiments of the invention will be described below in more detail with reference to the accompanying drawings. Those components that are the same or are in correspondence are rendered the same reference numeral regardless of the figure number, and redundant explanations are omitted.

First, a description will be provided on an insulating material based on an embodiment of the invention that can be used in a printed circuit board.

The insulating material based on an embodiment of the invention may be formed by impregnating a base material with a liquid composition, which can include 20 to 50 parts by weight of a PMDA-ODA mixture that includes pyromellitic dianhydride (PMDA) and oxydianiline (ODA) mixed in a weight ratio of 40:60 to 60:40, 50 to 80 parts by weight of a triazine derivative, and 300 to 600 parts by weight of an organic solvent, which can be one of dimethylformamide (DMF) and dimethylacetamide (DMAC) or a mixture thereof, and then curing the liquid composition.

When the pyromellitic dianhydride, oxydianiline, and triazine derivative react in an organic solvent, a triazine-modified flame-retardant resin may be obtained. The insulating material obtained by impregnating a base material with this resin and curing the resin can be used advantageously in a printed circuit board to implement circuits with finer lines.

The content of the pyromellitic dianhydride (PMDA) and oxydianiline (ODA) used in the liquid composition can be of a weight ratio between 40:60 and 60:40. In certain embodiments, a weight ratio between 45:55 and 55:45 can be used, and in certain embodiments, a weight ratio of about 50:50. A ratio outside the above range may lead to an excess of monomers that do not undergo polymerization, and may thus provide less desirable properties.

After preparing the liquid composition with 20 to 50 parts by weight of this PMDA-ODA mixture, 50 to 80 parts by weight of the triazine derivative, and 300 to 600 parts by weight of the organic solvent, which can be dimethylformamide (DMF) or dimethylacetamide (DMAC) or a mixture of the two, an insulating material can be fabricated by impregnating the base material with the liquid composition and curing the liquid composition.

Here, bismaleimide triazine can be used for the triazine derivative, and dimethylformamide (DMF) or dimethylacetamide (DMAC) or a mixture of the two can be used for the organic solvent. However, the invention is not thus limited.

The content of each component may advantageously be adjusted in consideration of differences in adhesion and contraction stability in the triazine derivative. If the content of the PMDA-ODA mixture is less than 20 parts by weight, there may be less dispersion at the surfaces of the substrate, leading to less effective surface treatment. On the other hand, if the content exceeds 50 parts by weight, the water absorption of bismaleimide triazine can be 1.0% or higher, which can lead to lower dimensional stability. If the content of the triazine derivative is lower than 50 parts by weight, there will be fewer COOH groups and hence fewer hydrophilic groups, which can cause problems in adhesion. Conversely, if the content of the triazine derivative exceeds 80 parts by weight, there may not be adequate dispersion with the PMDA-ODA mixture, leading to lower adhesion and less effective surface treatment. The organic solvent can be maintained within the range described above, in order to keep the composition in a liquid phase and in a suitable viscosity for impregnating the base material.

Curing agents and curing accelerators can be added to the liquid composition as necessary.

The fabricating of the insulating material according to an aspect of the invention is not limited to a particular method, and any of various methods can be used that combines the liquid composition described above with a base material to produce an insulating material. In one example, the base material can be impregnated with the liquid composition, so that the liquid composition may permeate through the base material. The resulting fabric can be subject to a curing operation, for example, at a temperature of about 180 to 250° C., and can be completely cured to fabricate an A-stage insulator.

Here, the base material can be a material such as fiberglass fabric, fiberglass non-woven fabric, polyamide fabric, polyamide non-woven fabric, polyester fabric, and polyester non-woven fabric, but is not thus limited. It can be advantageous to employ fiberglass fabric for the base material in terms of dimensional stability, and a thickness between 30 and 100 μm can be desirable for implementing fine-line circuits.

The insulator thus formed can be stacked, for example in two or more layers, after which heat and pressure can be applied to the arrangement, to obtain an unclad prepreg that may be used in the manufacture of a printed circuit board, for example. A metal foil can be arranged on one or either side of a prepreg obtained by stacking the insulators, after which heat and pressure can be applied to the arrangement, to obtain a metal clad laminate that may be used in the manufacture of a printed circuit board. Here, the metal foil may generally be a layer of copper or of aluminum, and may generally have a thickness of about 5 to 200 µm.

Preparation Example 150 g of a PMDA-ODA mixture that includes pyromellitic dianhydride and oxydianiline in a 1:1 weight ratio, and 250 g of bismaleimide triazine were added to 750 g of dimethylformamide to prepare a liquid composition. The liquid composition was impregnated into a roll type fiberglass fabric (thickness: 10 to 20 µm) and completely cured at 200° C. to fabricate an insulator for use in a printed circuit board.

The completely cured insulator can be cut according to the specifications for a substrate. Then, after stacking several layers of the insulator, copper foils were overlaid over both sides of the stack, and the arrangement was pressed for 120 minutes at 200° C. and 15 kg/cm2, to fabricate a copper clad laminate.

The insulating material described above can be utilized in the manufacture of a printed circuit board. That is, a circuit pattern can be formed on one side or either side of an insulator, as well as vias for interlayer connection. Of course, it is also possible to stack several of these insulators and form a circuit pattern and vias, etc., on or in each of the layers, to manufacture a multi-layer printed circuit board.

A description will now be provided in more detail on a method of manufacturing a printed circuit board using the insulating material described above.

FIG. 1 is a flowchart illustrating a method of manufacturing a printed circuit board according to an embodiment of the invention, and FIG. 2 through FIG. 15 are cross sectional views each representing a process for a method of manufacturing a printed circuit board according to an embodiment of the invention. In FIGS. 2 to 15, there are illustrated a copper clad laminate 10, a first insulator 11, copper foils 12, through-holes 21, a first seed layer 22, first plating resists 23, circuit patterns 30, vias 31, second insulators 40, 50, second seed layers 42, 52, second plating resists 43, 53, blind via holes 41, 51, blind vias 45, 55, solder resists 60, and plating layers 70.

Figure 3:
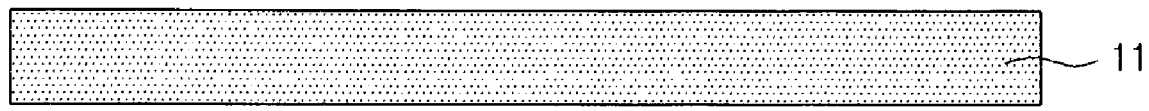
Figure 4:
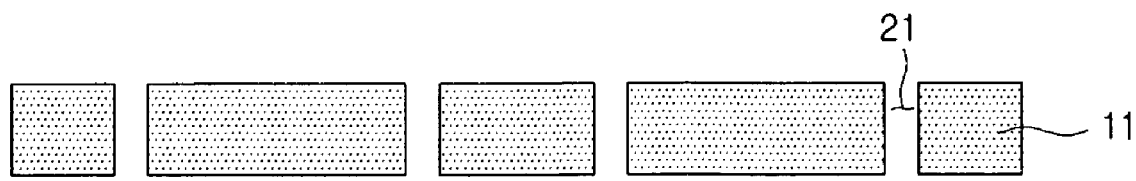

First, through-holes 21 may be formed in a first insulator 11 that correspond to vias (S110). This can be achieved using a method of preparing an unclad material that does not have metal foils formed thereon, as illustrated in FIG. 3, and then perforating the through-holes 21, as illustrated in FIG. 4. It is also possible to prepare a copper clad laminate (CCL) 10 that includes copper foils 12 formed on both sides of the first insulator 11 and generally etch the copper foils 12, to obtain the first insulator 11 as illustrated in FIG. 3. Of course, other methods may also be used, such as preparing an RCC (resin coated copper) type material and removing the metal portions.

Figure 5:
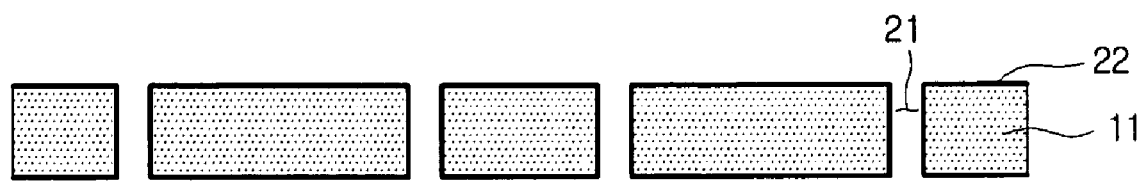

Next, a surface treatment can be applied to the first insulator 11 by irradiating an ion beam (S115), as illustrated in FIG. 5, and a first seed layer 22 can be formed over the inner walls of the through-holes 21 and over one side or both sides of the first insulator 11 (S120). Performing the surface treatment on the first insulator 11 using an ion beam may provide greater adhesion between the first seed layer 22 and the first insulator 11, to facilitate the forming of fine circuit lines.

Together with performing the surface treatment over the first insulator 11, a vacuum deposition method, such as E-beam processing, thermal evaporation, and sputtering, can also be used for forming the first seed layer 22, in order to further increase adhesion between the first insulator 11 and the first seed layer 22.

Using the composition described above for the first insulator 11 can maximize the efficiency of the surface treatment using an ion beam, so that the adhesion between the first insulator 11 and first seed layer 22 can be further improved.

Figure 6:
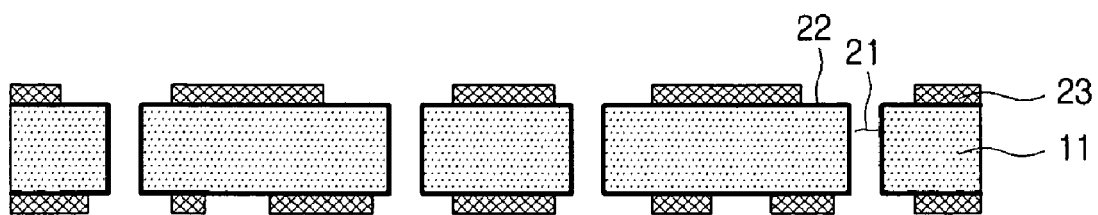

Next, as illustrated in FIG. 6, a first plating resist 23 can be formed on one side or either side of the first insulator 11 on which the first seed layer 22 is formed (S125), and electroplating can be performed in correspondence with the circuit patterns 30 and vias 31 (see FIG. 7) that are to be formed (S130), after which the first plating resist 23 can be removed (S135).

As illustrated in FIG. 6, the first plating resists 23 can be selectively formed over the insulation layer on which the first seed layer 22 is formed, and then electroplating can be performed, so that the plating layers may be formed only in the portions that are not covered by the first plating resists 23. The plating layers may later serve as circuit patterns 30 and as vias 31 for interconnecting layers (see FIG. 7).

Figure 7:
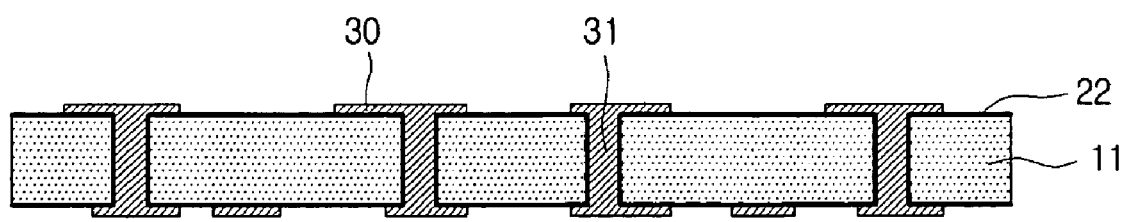

Although FIG. 7 illustrates the example in which plating is performed to completely fill the through-holes 21, this may not always be necessary, and the plating can also be performed to only a degree sufficient to connect either side of the first insulator 11.

Figure 8:
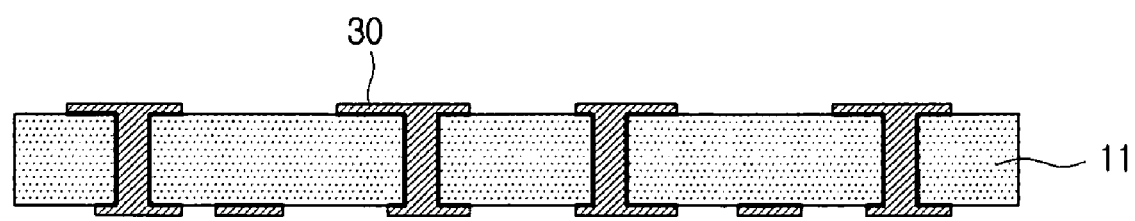

After thus performing the plating, flash etching can be performed to remove portions of the first seed layer 22 (see FIG. 7) (S140), as illustrated in FIG. 8. By performing flash etching, the portions that will serve as parts of the circuit patterns 30 can be separated electrically, and as a result, a double-sided printed circuit board can be manufactured.

In cases where a multi-layer printed circuit board is to be manufactured, build-up layers may additionally be formed on one or either side of the printed circuit board such as that illustrated in FIG. 8. A more detailed description will now be provided.

Figure 9:
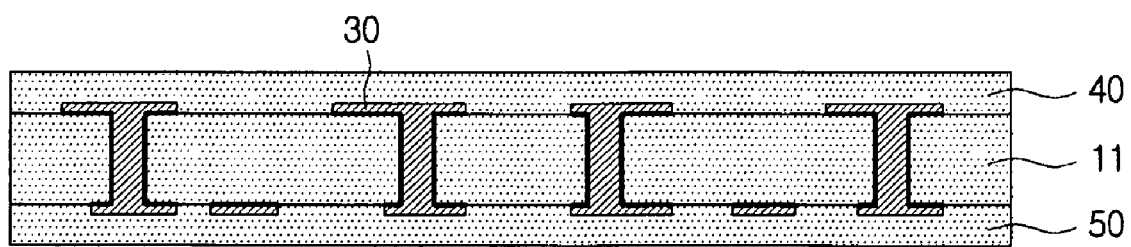

First, as illustrated in FIG. 9, a second insulator 40, 50 can be stacked on one side or either side of the first insulator 11 (S145). Although this particular embodiment is described using an example in which the second insulators 40, 50 are stacked over both sides of the first insulator 11, it is also possible to stack the second insulator on only one side of the first insulator 11 as necessary.

Here, the material for the second insulators 40, 50 can be of substantially the same composition as that of the material for the first insulator 11. The description on the composition for the first insulator 11 has been presented above and thus will not be repeated.

Figure 10:
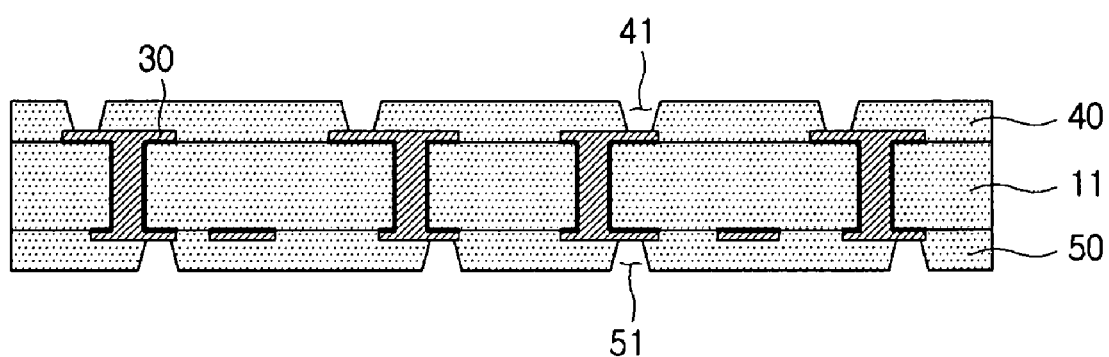
Figure 11:
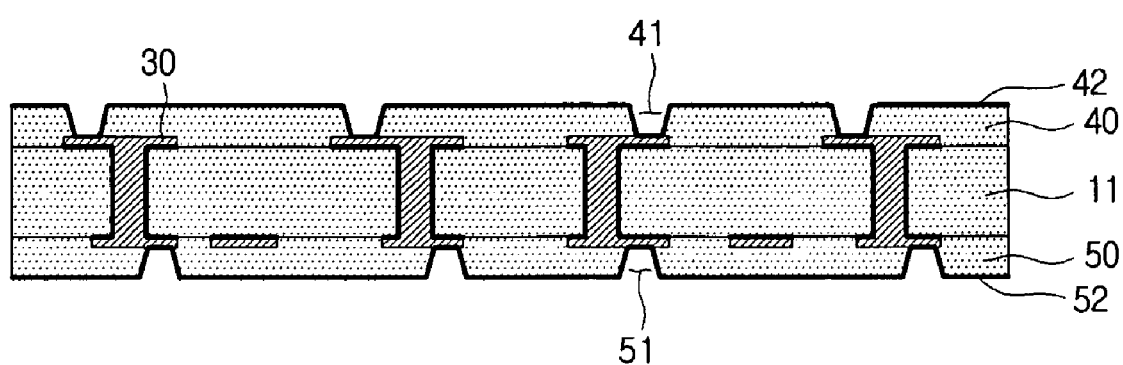

Next, as illustrated in FIG. 10, blind via holes 41, 51 can be formed in the second insulators 40, 50 (S150), and surface treatment can be applied to the second insulators 40, 50 by irradiating ion beams (S155), after which second seed layers 42, 52 can be formed over the surfaces of the second insulators 40, 50 (S160), as illustrated in FIG. 11. Performing the surface treatment on the second insulators 40, 50 using an ion beam may provide greater adhesion between the second seed layers 42, 52 and the second insulators 40, 50, to facilitate the forming of fine circuit lines.

Together with performing the surface treatment over the second insulators 40, 50, a vacuum deposition method, such as E-beam processing, thermal evaporation, and sputtering, can also be used for forming the second seed layers 42, 52, in order to further increase adhesion between the second insulators 40, 50 and the second seed layers 42, 52.

Using the composition described above for the second insulators 40, 50 can maximize the efficiency of the surface treatment using an ion beam, so that the adhesion between the second insulators 40, 50 and second seed layers 42, 52 may be further improved.

Figure 12:
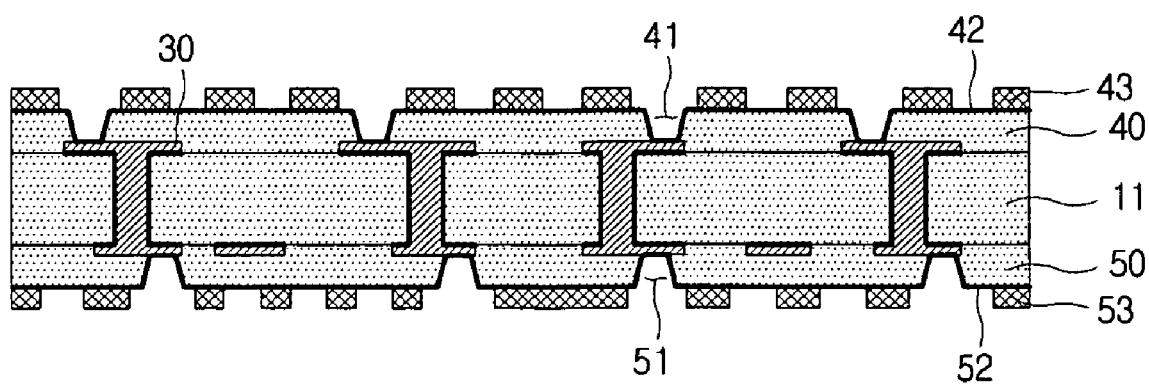

Next, as illustrated in FIG. 12, second plating resists 43, 53 can be formed over the surfaces of the second insulators 40, 50 on which the second seed layers 42, 52 are formed (S165), and electroplating can be performed (S170) so that circuit patterns and blind vias 44, 54 (see FIG. 13) may be formed, after which the second plating resists 43, 53 can be removed (S175).

Figure 13:
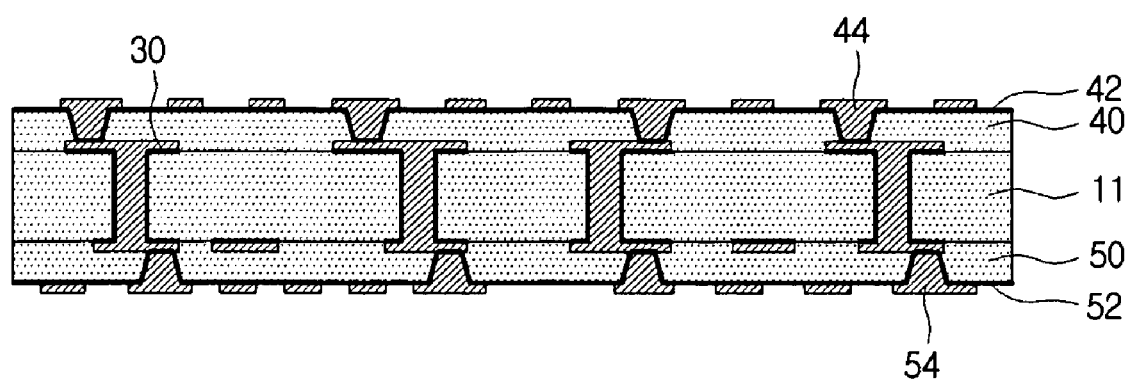

Although FIG. 13 illustrates the example in which plating is performed to completely fill the blind via holes 41, 51 (see FIG. 12), this may not always be necessary, and the plating can also be performed to only a degree sufficient to connect either side of each second insulator 40, 50.

Figure 14:
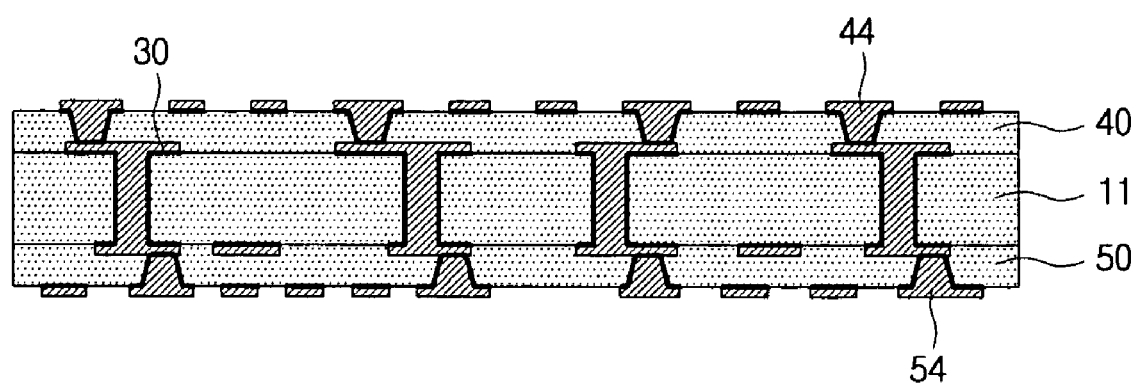

After thus performing the plating, flash etching can be performed to remove portions of the second seed layers 42, 52 (see FIG. 7) (S180), as illustrated in FIG. 14.

Figure 15:
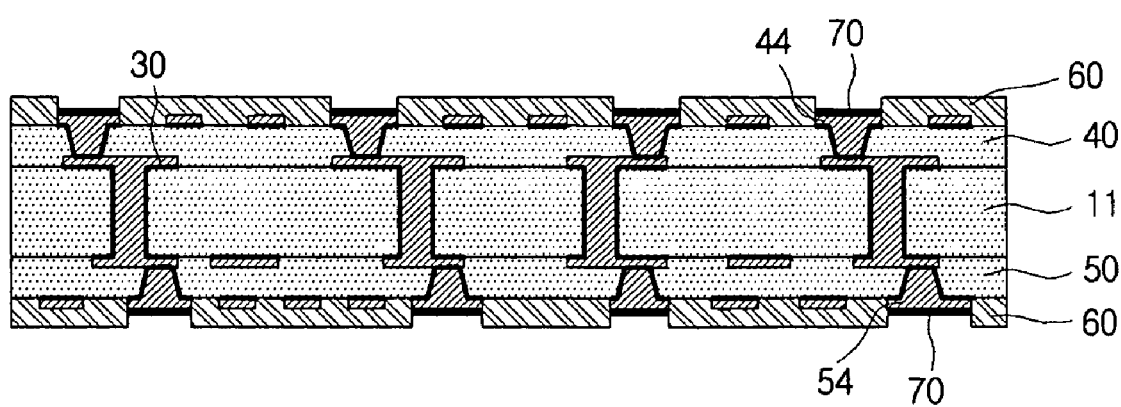

Afterwards, solder resists 60 can be formed, as illustrated in FIG. 15, and nickel/gold plating layers 70 can be formed over portions of the circuit patterns uncovered to allow connection with an external device, etc., that is, the nickel/gold plating layers 70 can be formed over the pads, in order to improve connection reliability.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention. As such, many embodiments other than those set forth above can be found in the appended claims.

What is claimed is:

1. An insulating material formed by impregnating a base material with a liquid composition and curing the liquid composition, the liquid composition comprising:
   20 to 50 parts by weight of a PMDA-ODA mixture, the PMDA-ODA mixture including pyromellitic dianhydride (PMDA) and oxydianiline (ODA) mixed in a weight ratio of 40:60 to 60:40;
   50 to 80 parts by weight of a triazine derivative; and
   300 to 600 parts by weight of an organic solvent.

2. The insulating material of claim 1, wherein the triazine derivative is bismaleimide triazine.

3. The insulating material of claim 1, wherein the organic solvent is selected from a group consisting of dimethylformamide (DMF), dimethylacetamide (DMAC), and mixtures thereof.

4. The insulating material of claim 1, wherein the base material is selected from a group consisting of fiberglass fabric, fiberglass non-woven fabric, polyamide fabric, polyamide non-woven fabric, polyester fabric, and polyester non-woven fabric.

5. The insulating material of claim 1, wherein the curing of the liquid composition is performed at a temperature of 180 to 250° C.

6. A printed circuit board comprising:
   an insulator;
   a circuit pattern formed on one or either side of the insulator; and
   a via penetrating the insulator,
   wherein the insulator is formed by impregnating a base material with a liquid composition and curing the liquid composition, the liquid composition comprising:
   20 to 50 parts by weight of a PMDA-ODA mixture, the PMDA-ODA mixture including pyromellitic dianhydride (PMDA) and oxydianiline (ODA) mixed in a weight ratio of 40:60 to 60:40;
   50 to 80 parts by weight of a triazine derivative; and
   300 to 600 parts by weight of an organic solvent.

7. The printed circuit board of claim 6, wherein the triazine derivative is bismaleimide triazine.

8. The printed circuit board of claim 6, wherein the organic solvent is selected from a group consisting of dimethylformamide (DMF), dimethylacetamide (DMAC), and mixtures thereof.

9. The printed circuit board of claim 6, wherein the base material is selected from a group consisting of fiberglass fabric, fiberglass non-woven fabric, polyamide fabric, polyamide non-woven fabric, polyester fabric, and polyester non-woven fabric.

10. The printed circuit board of claim 6, wherein the curing of the liquid composition is performed at a temperature of 180 to 250° C.

* * * * *